(12) United States Patent
Lum et al.

(10) Patent No.: US 7,474,978 B2
(45) Date of Patent: Jan. 6, 2009

(54) HIGH DYNAMIC RANGE OPTICAL RECEIVER

(75) Inventors: Kok Keong Richard Lum, Singapore (SG); Lei Chen, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 126 days.

(21) Appl. No.: 11/591,760

(22) Filed: Oct. 31, 2006

(65) Prior Publication Data
US 2008/0101803 A1 May 1, 2008

(51) Int. Cl.
*G01C 17/38* (2006.01)
(52) U.S. Cl. .......................................... 702/95
(58) Field of Classification Search ................... 702/95; 327/311; 330/110; 235/436
See application file for complete search history.

(56) References Cited

U.S. PATENT DOCUMENTS

| | | | |
|---|---|---|---|
| 5,073,700 A | * | 12/1991 | D'Onofrio ................... 235/436 |
| 5,606,277 A | * | 2/1997 | Feliz ........................... 327/311 |
| 6,844,784 B1 | | 1/2005 | Denoyer |
| 6,873,207 B2 | * | 3/2005 | Sakuno ....................... 330/110 |

FOREIGN PATENT DOCUMENTS

| | | |
|---|---|---|
| DE | 3113220 | 3/1982 |
| GB | 2016686 | 9/1979 |
| JP | 63-102360 | 5/1988 |
| JP | 03-003536 | 1/1991 |
| JP | 10-284953 | 10/1998 |
| JP | 2004-225611 | 8/2004 |

* cited by examiner

*Primary Examiner*—Tung S Lau
*Assistant Examiner*—Xiuquin Sun

(57) ABSTRACT

An optical receiver having a photodetector, amplifier, feedback loop, and output circuit is disclosed. The photodetector generates a current between first and second nodes in response to being illuminated with light. The amplifier has an input connected to the first node and an output connected to a third node. The feedback path connects the third node to the first node, and includes a diode in series with a circuit element having an impedance greater than a predetermined value, the diode is connected between the first and fourth nodes. The output circuit is connected to the fourth node and provides an output signal to an external circuit. The output circuit can be configured to provide an output signal that is proportional to the logarithm of the intensity of the light that illuminates the photodetector.

13 Claims, 5 Drawing Sheets

HIGH DYNAMIC RANGE OPTICAL RECEIVER

BACKGROUND OF THE INVENTION

Optical receivers are used in a large number of light sensing applications. The receiver typically includes a photodetector that is illuminated by a light signal and generates a current that is related to the intensity of the light. This current is converted to a voltage by an interface circuit to provide an output signal that is utilized by an apparatus connected to the optical receiver.

In some light sensing applications, an output signal that is proportional to the logarithm of the light intensity is particularly useful. For example, the apparatus that is processing the output signal may need to compute the product or ratio of two light signals. This computation can be performed on the logarithmic signals using simple addition or subtraction circuits.

In other light sensing applications, the amplitude of the light signal can vary by a factor of more than 100,000. Providing an output signal that is proportional to the intensity of light in these situations is not practical, since the circuitry that processes the light signals has a fixed maximum potential and sensitivity. If the circuitry is set to provide the maximum output at the highest intensity, then the sensitivity of the circuitry at the lowest light levels is insufficient. In this regard, it should be noted that many circuit elements have intrinsic noise that overwhelms very small signals. If, on the other hand, the circuits are designed to provide adequate sensitivity at the low light levels, the circuits will saturate at the high light levels and differences in intensity levels at high light intensities cannot be measured. One solution to this problem is to provide an output signal that is related to the logarithm of the light intensity. Such a signal provides the required sensitivity at all light levels.

A transimpedance amplifier (TIA) is often used to convert the current signal from devices such as photodiodes to a voltage signal that is then utilized by other circuits. TIA designs that convert the input current signal to a voltage that is proportional to the logarithm of the input current could, in principle, be constructed by replacing the feedback resistor in the conventional TIA with a diode. However, such circuits have stability problems. To overcome these stability problems in applications requiring a very high dynamic range, the amplifier must have a very high frequency capability that can only be achieved at power levels that make such TIAs impractical for many applications.

SUMMARY OF THE INVENTION

The present invention includes an optical receiver having a photodetector, amplifier, feedback loop, and output circuit. The photodetector generates a current between first and second nodes in response to being illuminated with light. The amplifier has an input connected to the first node and an output connected to a third node. The feedback path connects the third node to the first node, and includes a diode in series with a circuit element having an impedance greater than a predetermined value, the diode is connected between first and fourth nodes. The output circuit is connected to the fourth node and provides an output signal to an external circuit. The output circuit can be configured to provide an output signal that is proportional to the logarithm of the intensity of the light that illuminates the photodetector.

DETAILED DESCRIPTION OF EMBODIMENTS OF THE PRESENT INVENTION

Figure 1:
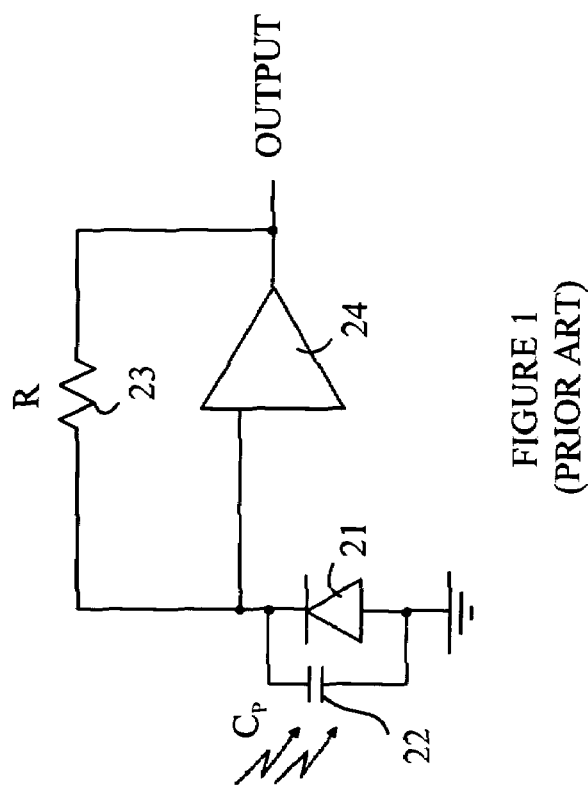
FIG. 1 is a schematic diagram of a prior art photodiode connected to a conventional TIA.

The manner in which the present invention provides its advantages can be more easily understood with reference to FIG. 1, which is a prior art schematic diagram of a photodiode connected to a conventional TIA. When photodiode 21 is illuminated, a current flows through photodiode 21 and the output of amplifier 24 increases until the same amount of current flows through feedback resistor 23. There is a maximum output voltage that the amplifier can provide. If the feedback resistor is set to provide this output voltage for the highest anticipated value of the photocurrent in photodiode 21, then the sensitivity of the circuit at very low light levels can be insufficient for many applications. Conversely, if the resistance is set at a value that provides high sensitivity at low light levels, the amplifier will saturate at higher levels.

In principle, this problem can be overcome by replacing resistor 23 with a circuit that changes impedance as the photocurrent changes. The impedance would decrease as the photocurrent increases, thereby providing high sensitivity at low light levels while preventing the amplifier from saturating at high light levels. In such a TIA, the output signal would now be a non-linear function of the illumination level; however, the output would have the desired dynamic range.

Figure 2:
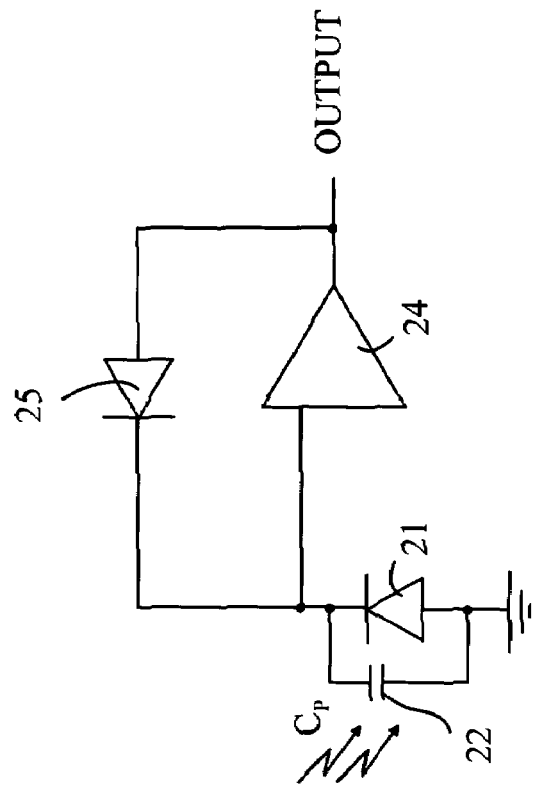
FIG. 2 is a schematic diagram of a photodiode connected to a TIA that utilizes a diode to provide the variable resistance in question.

Refer now to FIG. 2, which is a schematic diagram of a photodiode connected to a TIA that utilizes a diode to provide the variable resistance in question. Diode 25 replaces resistor 23 in the circuit shown in FIG. 1. Otherwise the circuit functions in an analogous manner. Since the current through diode 25 is an exponential function of the potential across the diode, the output of amplifier 24 will now be a function of the logarithm of the photocurrent.

Unfortunately all photodiodes have a parasitic capacitance 22. As a result, to provide stable operation when the light signal changes with time, amplifier 24 must have an adequate frequency response. The required frequency response is inversely proportional to $RC_p$. At high photocurrents, the impedance of diode 25 is very low. Hence, to accommodate this very low feedback resistance, the amplifier must have a very high frequency response. Such high frequency amplifiers require large amounts of power, and hence, are impractical for many applications. In general, the power requirements limit the maximum dynamic range that can be provided with this simple design.

Figure 3:
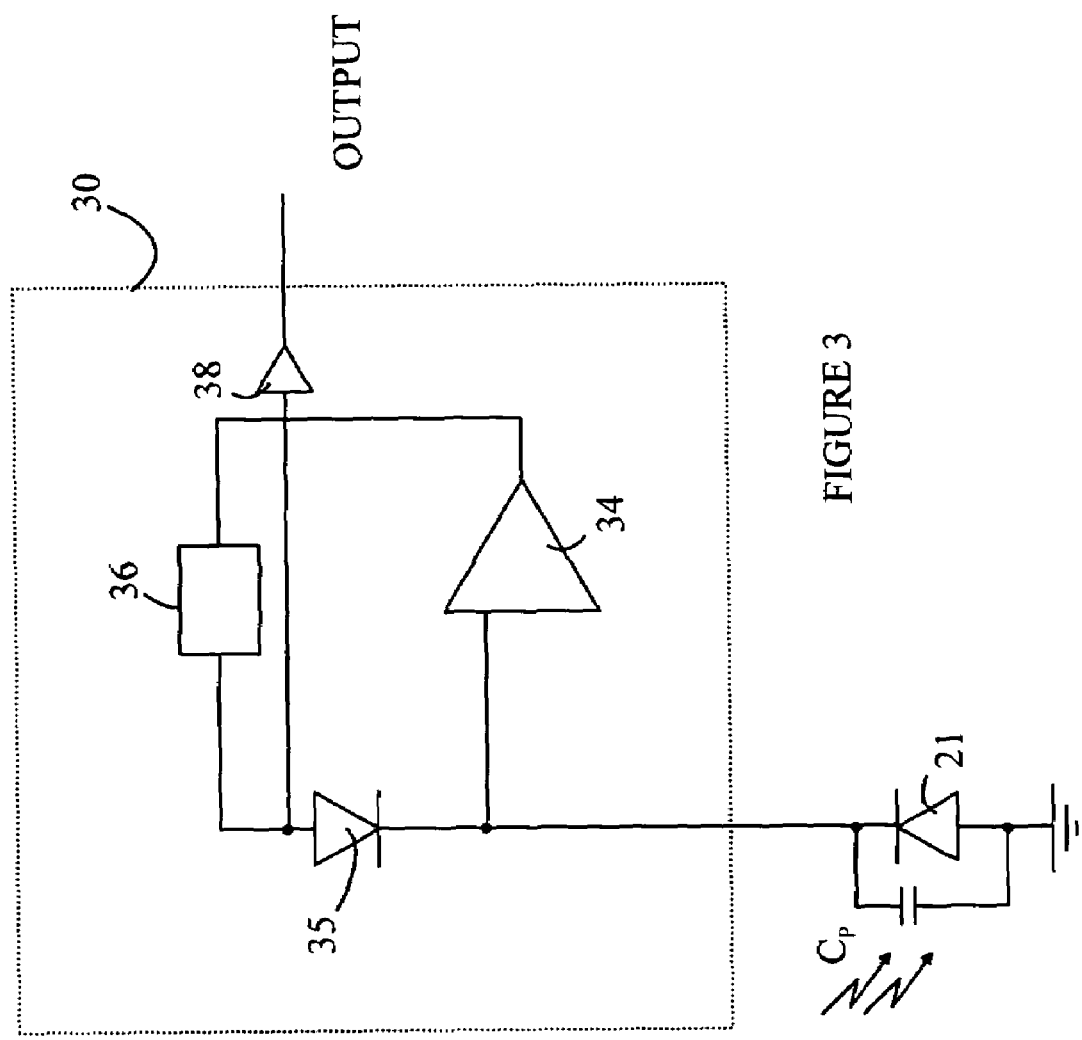
FIG. 3 is a schematic diagram of an optical receiver having a TIA circuit according to the present invention connected to a photodiode.

Refer now to FIG. 3, which is a schematic diagram of an optical receiver having a TIA circuit according to one embodiment of the present invention connected to a photodiode. TIA 30 utilizes an amplifier 34 having a feedback circuit consisting of diode 35 and an impedance element 36. The inclusion of impedance element 36 assures that the feedback path has an equivalent minimum impedance R'. If the maximum frequency response of amplifier 34 that can be utilized and the maximum parasitic capacitance Cp are known, the value R' can be obtained. Hence, the feedback loop will always have an impedance that assures stable operation.

In principle, impedance element 36 could be a resistor. Amplifiers of this type are often referred to as log-linear amplifiers. However, utilizing a resistor in the feedback loop presents a number of other problems. First, the output of amplifier 34 is no longer a logarithmic function of the photocurrent through photodiode 21. Second, large resistors require a large silicon area, which substantially increases the cost of the optical receiver. Third, at large photodiode currents, resistor 36 causes the output of amplifier 34 to saturate, and hence limits the dynamic range of the optical receiver.

In the present invention, the first problem is overcome by providing an output signal that measures the voltage across the diode in the feedback path, rather than the voltage at the output of the amplifier. The present invention is based on the observation that the potential across diode 35 is still a logarithmic function of the photocurrent. If the input to amplifier 34 is referenced to ground; the output in TIA 30 is taken from the anode of diode 35. A buffer 38 can be used to prevent the device attached to the output from interfering with the operation of TIA 30. In embodiments that utilize a single power supply, the input to amplifier 34 is normally referenced to some known positive potential rather than ground. In this case, the output at the anode of diode 35 is a logarithmic function of the photodiode current, plus a fixed DC biasing voltage, which can be easily removed.

To overcome the saturation problem discussed above, resistor 36 can be replaced by an impedance element that only presents a small resistive load to amplifier 34 while providing a large impedance to the photodiode. That is, the equivalent impedance for current flowing from the amplifier to diode 35 is much less than that for current flowing in the reverse direction. With a small resistive loading, the output of amplifier 34 will not saturate even at large photodiode currents. The resistive load presented to the feedback diode is preferably greater than the resistance of the feedback diode 35 when the current through the feedback diode is at its maximum design value.

Figure 4:
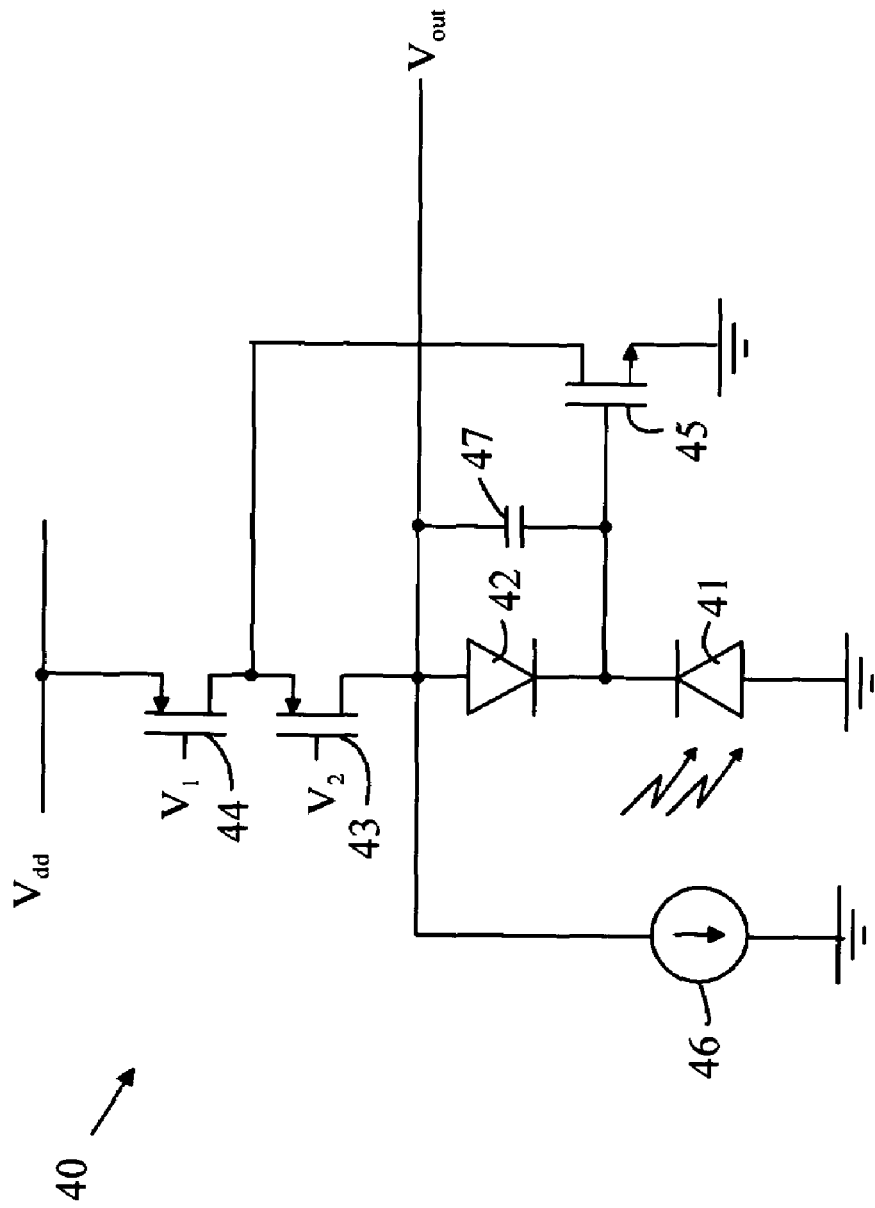
FIG. 4 is a schematic drawing of an optical receiver that utilizes a TIA according to the present invention.

Refer now to FIG. 4, which is a schematic drawing of an optical receiver that utilizes a TIA according to the present invention. Optical receiver 40 utilizes two transistors that are biased to provide resistive functions. Transistor 45 is the amplifier in the TIA and utilizes transistor 44 for proper DC biasing. Transistor 43 provides the function of the impedance element discussed above. It should be noted that transistor 43 provides a small impedance loading on amplifier 45, and, in addition, requires significantly less silicon area to implement. Feedback diode 42 is analogous to diode 35 shown in FIG. 3. The output voltage is the logarithm of the photocurrent through photodiode 41. To assure that transistor 43 remains in saturation under all photodiode conditions, a constant current source 46 draws a fixed current through transistor 43 that bypasses diode 42. Current source 46 defines the equivalent impedance at the drain of transistor 43. For example, if the current through current source 46 is set to be roughly the same value as the maximum photodiode current, the equivalent impedance at the drain of transistor 43 is a very slow varying function of the photodiode current for values of that current below the maximum photodiode current. This simplifies the implementation of the optical receiver and assures that the minimum equivalent impedance is achieved, and hence, AC stability is guaranteed.

The inclusion of compensation capacitor 47 extends the bandwidth of optical receiver 40 when the current from the photodiode is small. In this case, the feedback loop has a long time constant equal to the impedance diode 42 times the parasitic capacitance of diode 41. At low photocurrents, the impedance of diode 42 is high. The compensation capacitor lowers this impedance for the high frequency component of the photocurrent signal.

Figure 5:
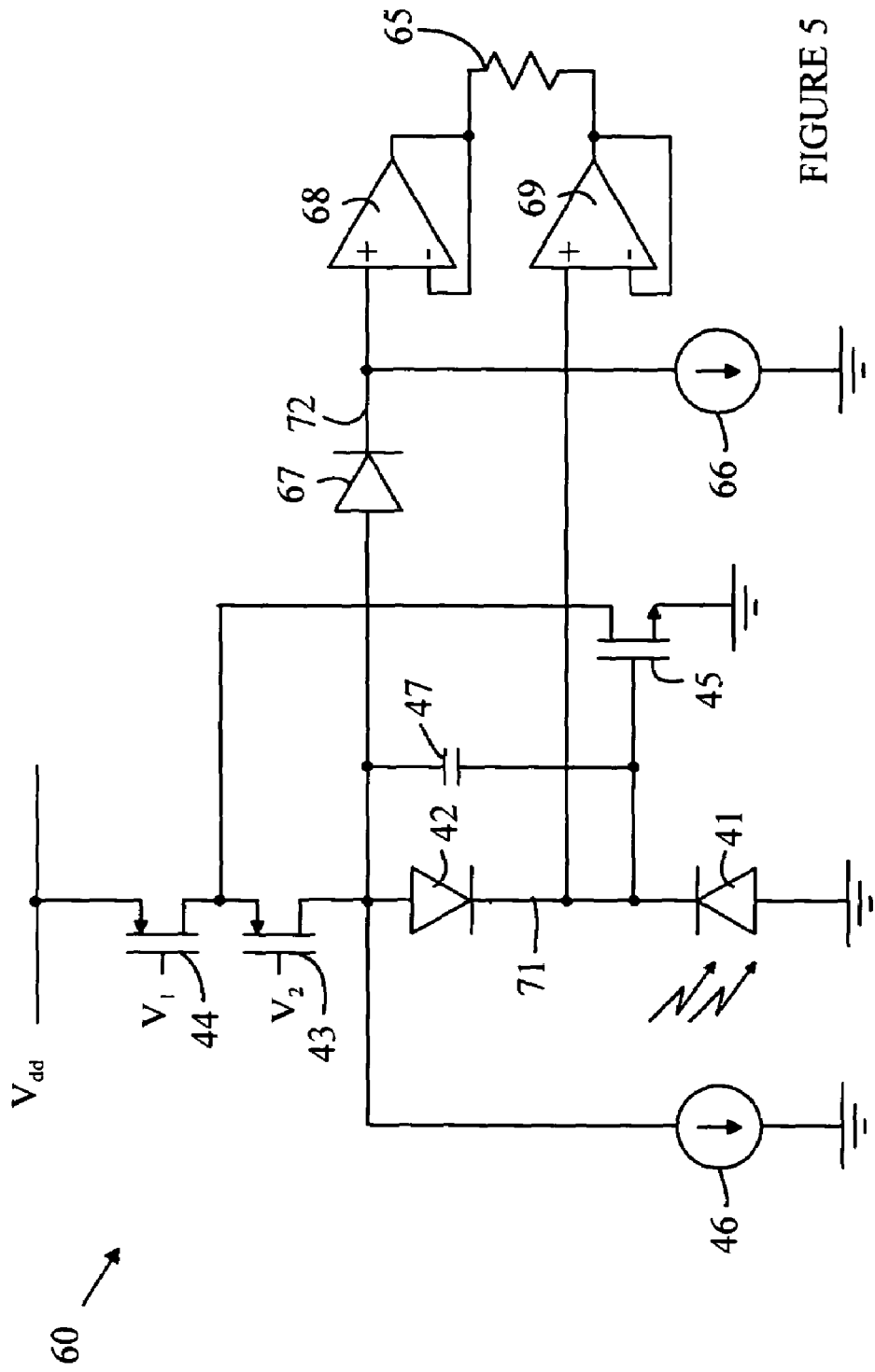
FIG. 5 is a schematic drawing of another embodiment of an optical receiver according to the present invention.

Refer now to FIG. 5, which is a schematic drawing of another embodiment of an optical receiver according to the present invention. Optical receiver 60 provides a current into load 65 that is the logarithm of the light intensity received by photodiode 41. Those elements of optical receiver 60 that provide functions analogous to elements discussed above with reference to optical receiver 40 shown in FIG. 4 have been given the same numeric designations and will not be discussed further here. Diode 67 and current source 66 provide a reference potential at the input to buffer 68. The voltages at nodes 71 and 72 are buffered separately by buffers 68 and 69 before being applied to load 65.

The manner in which the current through transistor 43 is set depends on the particular application in which the optical receiver functions. In a slow application, the speed requirement on the optical receiver is not high, and hence, the current can be set low such that the TIA is optimized for low power operation with just enough bandwidth to accommodate the light signals. If the optical receiver must operate at high speed, the current must be larger so that the equivalent feedback resistor is low enough to provide an acceptable time constant.

Figure 6:
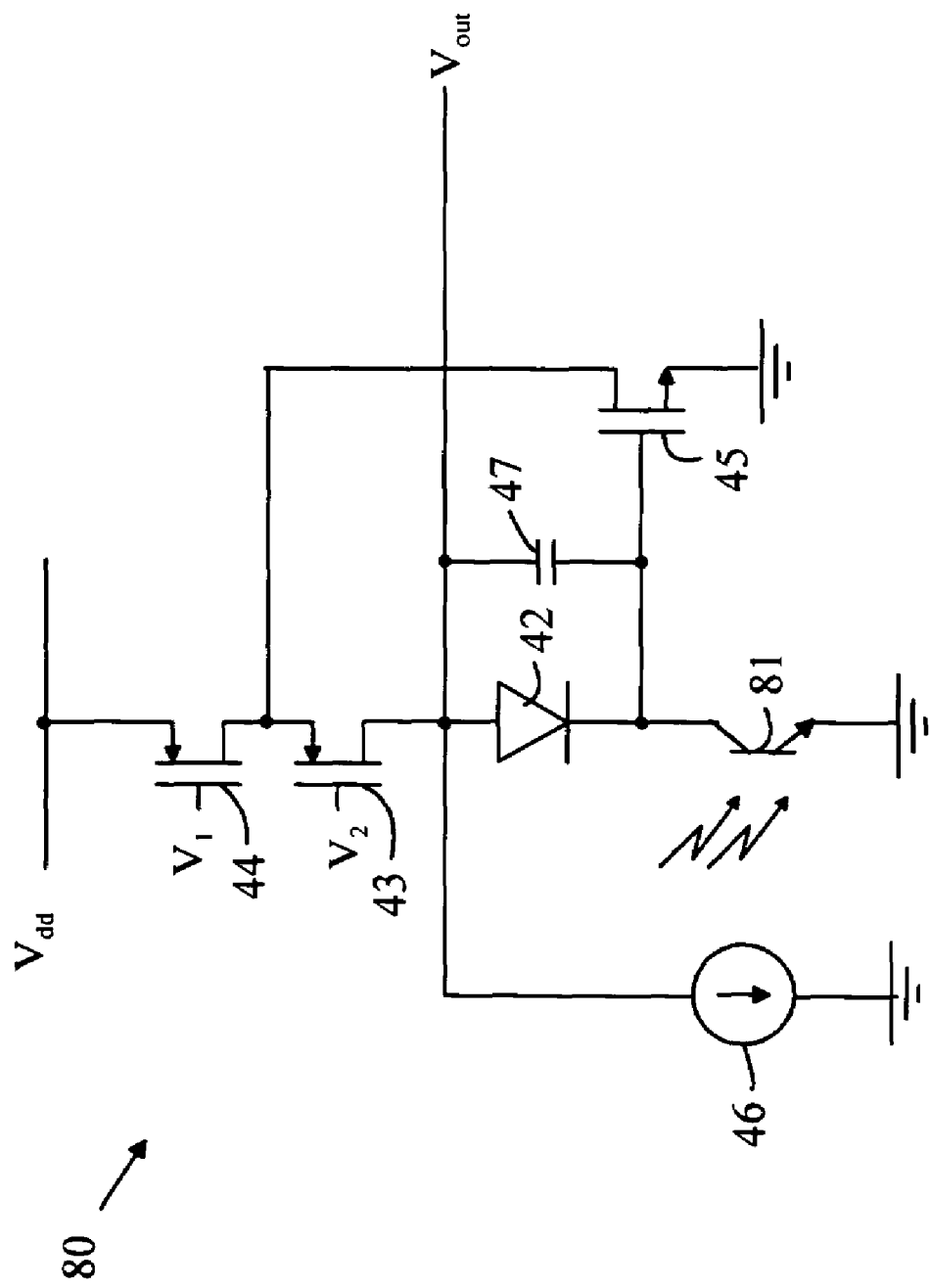
FIG. 6 is a schematic drawing of another embodiment of an optical receiver according to the present invention.

The above-described embodiments of the present invention utilize a photodiode to convert the input light signal to a current that is then amplified. However, other forms of photodetector can be utilized. For example, the photodiodes discussed above could be replaced by phototransistors. Refer now to FIG. 6, which illustrates another embodiment of an optical receiver according to the present invention. Optical receiver 80 differs from optical receiver 40 shown in FIG. 4 in that photodiode 41 has been replaced by a phototransistor 81.

Various modifications to the present invention will become apparent to those skilled in the art from the foregoing description and accompanying drawings. Accordingly, the present invention is to be limited solely by the scope of the following claims.

What is claimed is:

1. An optical receiver, comprising:
    a photodetector configured to generate a current between first and second nodes in response to being illuminated with light, said photodetector being further configured to provide a parasitic capacitance between said first and second nodes;
    an amplifier having an input connected to said first node and an output connected to a third node, said amplifier being characterized by a frequency range over which said amplifier is to operate in a stable manner;
    a feedback path connecting said third node to said first node, said feedback path comprising a diode in series with a circuit element configured to have an impedance greater than a predetermined value, said diode being connected between first and fourth nodes;
    an output circuit connected to said fourth node, said output circuit providing an output signal to an external circuit, wherein said predetermined value depends on said frequency range and said parasitic capacitance; and a constant current source configured to cause a fixed current to flow through said transistor when said photodetector is not illuminated.

2. The optical receiver of claim 1, wherein said circuit element is configured to have an impedance for current flowing from said third node to said first node that is less than the impedance of said circuit element for current flowing from said first node to said third node.

3. The optical receiver of claim 1, wherein said circuit element comprises a transistor.

4. The optical receiver of claim 1, wherein said amplifier comprises a transistor having a collector or drain connected to said third node and a base or gate connected to said first node.

5. The optical receiver of claim 1, wherein said output circuit comprises a circuit configured to generate an output current in an external load, said output current having a magnitude related to the current flowing through said diode.

6. The optical receiver of claim 1, wherein said output signal is proportional to the logarithm of the intensity of said light that illuminates said photodetector.

7. The optical receiver of claim 1, wherein said photodetector comprises a photodiode.

8. The optical receiver of claim 1, wherein said photodetector comprises a phototransistor.

9. A circuit for amplifying an input current flowing between first and second nodes, comprising:
   an amplifier having an input connected to said first node and an output connected to a third node;
   a feedback path connecting said third node to said first node, said feedback path comprising a diode in series with a circuit element having an impedance for current flowing from said third node to said first node that is less than the impedance of said circuit element for current flowing from said first node to said third node, said diode being connected between said first and fourth nodes;
   an output circuit connected to said fourth node, said output circuit providing an output signal to an external circuit; and
   a constant current source configured to cause a fixed current to flow through said transistor when said input current is zero.

10. The circuit of claim 9, wherein said circuit element comprises a transistor.

11. The circuit of claim 9, wherein said amplifier comprises a transistor having a collector or drain connected to said third node and a base or gate connected to said first node.

12. The circuit of claim 9, wherein said output circuit comprises a circuit configured to generate an output current in an external load, said output current having a magnitude related to the current flowing through said diode.

13. The circuit of claim 9, wherein said output signal is proportional to the logarithm of the intensity of said light that illuminates said photodetector.

* * * * *